United States Patent
Kim et al.

(10) Patent No.: US 12,232,283 B2
(45) Date of Patent: Feb. 18, 2025

(54) DISPLAY DEVICE

(71) Applicant: LG ELECTRONICS INC., Seoul (KR)

(72) Inventors: Philsang Kim, Seoul (KR); Hyosik Shin, Seoul (KR); Laio Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 194 days.

(21) Appl. No.: 17/634,515

(22) PCT Filed: Aug. 13, 2020

(86) PCT No.: PCT/KR2020/010711
§ 371 (c)(1),
(2) Date: Feb. 10, 2022

(87) PCT Pub. No.: WO2021/034000
PCT Pub. Date: Feb. 25, 2021

(65) Prior Publication Data
US 2022/0346250 A1 Oct. 27, 2022

(30) Foreign Application Priority Data

Aug. 16, 2019 (KR) .................. 10-2019-0100281
Apr. 13, 2020 (KR) .................. 10-2020-0044411

(51) Int. Cl.
*H05K 5/00* (2006.01)
*H05K 5/02* (2006.01)
(52) U.S. Cl.
CPC ......... *H05K 5/0217* (2013.01); *H05K 5/0018* (2022.08)

(58) Field of Classification Search
CPC ............... H05K 5/0217; H05K 5/0018; G02F 1/133305; B65H 75/10; B65H 75/44; G06F 1/16; G09F 9/30
See application file for complete search history.

(56) References Cited

U.S. PATENT DOCUMENTS 8,009,422 B2 * 8/2011 Misawa ............ G02F 1/133308
345/157
8,493,714 B2 * 7/2013 Visser ................. H04M 1/0237
361/679.01

(Continued)

FOREIGN PATENT DOCUMENTS

KR      1020110135675      12/2011
KR      101458659          11/2014

(Continued)

OTHER PUBLICATIONS

PCT International Application No. PCT/KR2020/010711, International Search Report dated Nov. 25, 2020, 8 pages.

*Primary Examiner* — Rockshana D Chowdhury
(74) *Attorney, Agent, or Firm* — LEE, HONG, DEGERMAN, KANG & WAIMEY

(57) ABSTRACT

A display device is disclosed. According to an aspect of the present disclosure, the display device of the present disclosure may include: a flexible display panel; a panel roller which is elongated, and around which the display panel is rolled or unrolled; and a side frame coupled to a lateral side of the display panel and rolled around or unrolled from the panel roller along with the display panel, wherein the side frame may include: a core elongated along the lateral side of the display panel and facing the lateral side of the display panel; a first part covering the core; a second part extending from the first part and facing one surface of the display (Continued)

panel; and a third part extending from the first part and opposite to the second part with respect to the display panel.

11 Claims, 20 Drawing Sheets

(56) References Cited

U.S. PATENT DOCUMENTS

| | | | | |
|---|---|---|---|---|
| 8,516,728 B2* | 8/2013 | Jung | ................ | G09F 9/301 |
| | | | | 40/607.01 |
| 8,654,519 B2* | 2/2014 | Visser | ................ | G09F 11/30 |
| | | | | 361/679.21 |
| 9,098,241 B1* | 8/2015 | Cho | ................ | B65H 75/28 |
| 9,823,700 B2* | 11/2017 | Lee | ................ | G06F 1/1652 |
| 10,430,923 B2* | 10/2019 | Lu | ................ | H05K 1/028 |
| 2015/0047796 A1* | 2/2015 | Peng | ................ | G09F 11/34 |
| | | | | 160/323.1 |
| 2015/0316962 A1* | 11/2015 | Howes | ................ | G09F 15/0031 |
| | | | | 16/87.2 |
| 2015/0340004 A1* | 11/2015 | Pang | ................ | G06F 1/1652 |
| | | | | 345/205 |
| 2016/0187929 A1* | 6/2016 | Kim | ................ | G06F 1/1643 |
| | | | | 345/184 |
| 2017/0156219 A1* | 6/2017 | Heo | ................ | G06F 1/1679 |

FOREIGN PATENT DOCUMENTS

| | | |
|---|---|---|
| KR | 1020160059372 | 5/2016 |
| KR | 101654262 | 9/2016 |
| KR | 1020170006013 | 1/2017 |

* cited by examiner

[FIG. 1]
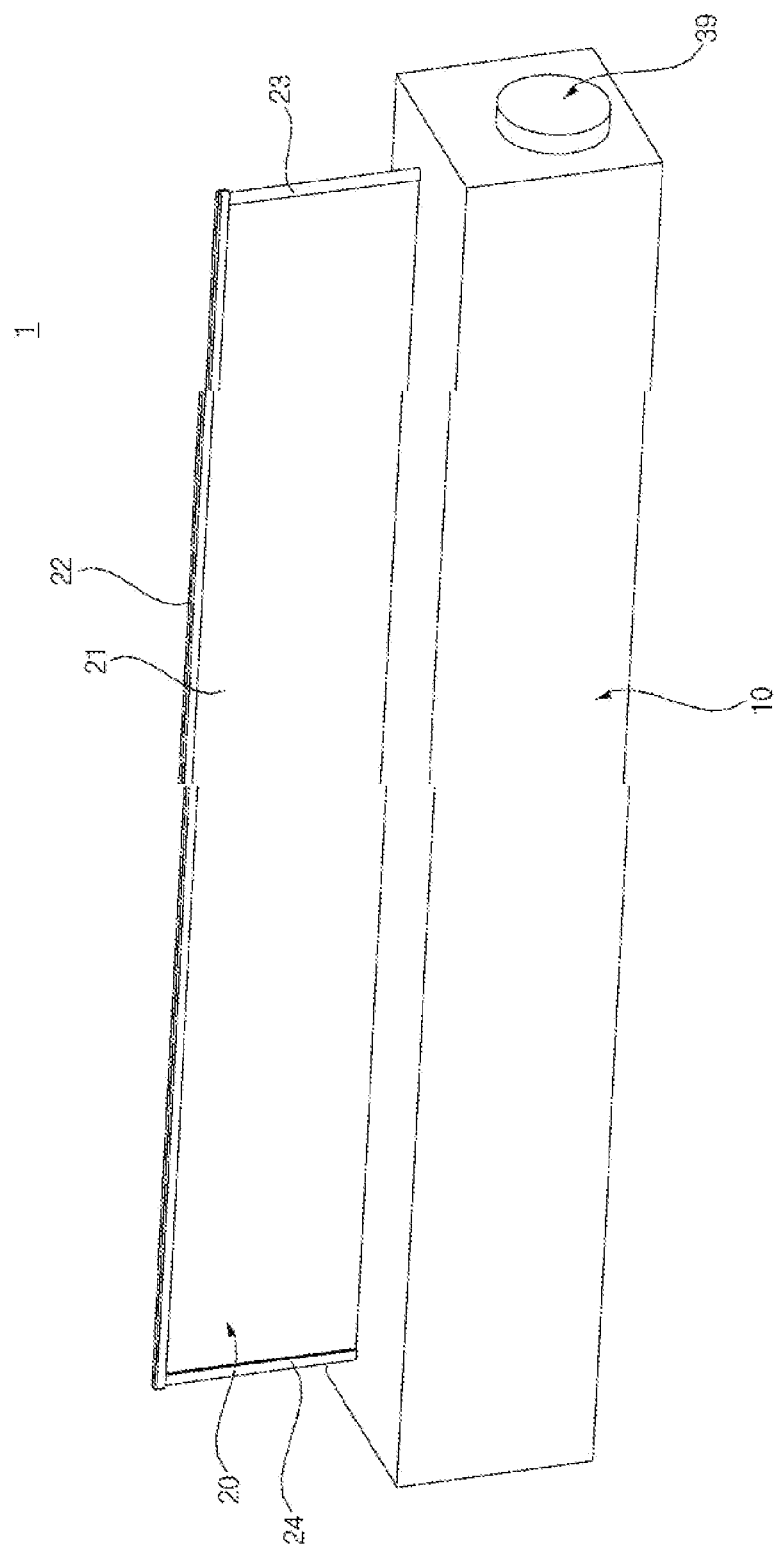

[FIG. 2]
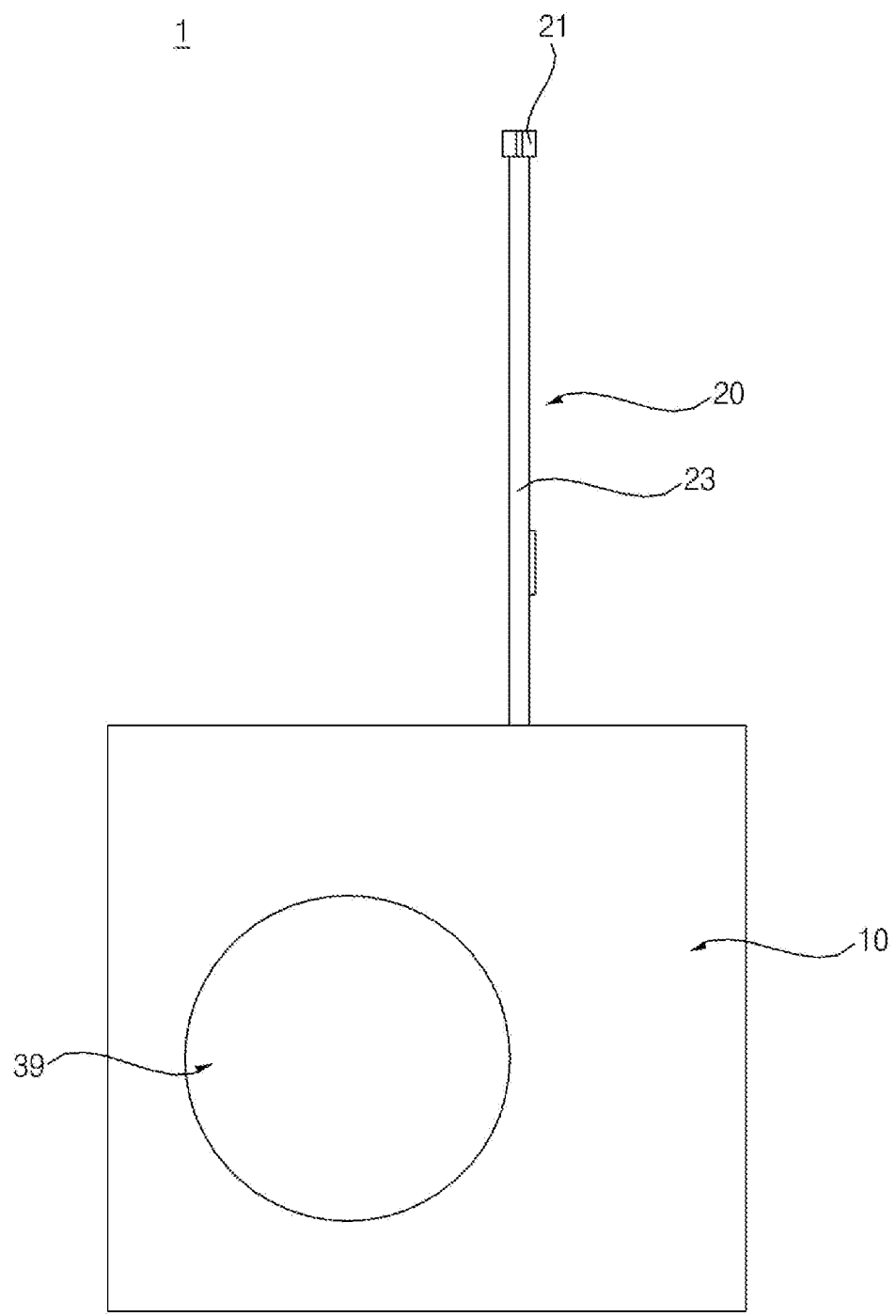

[FIG. 3]
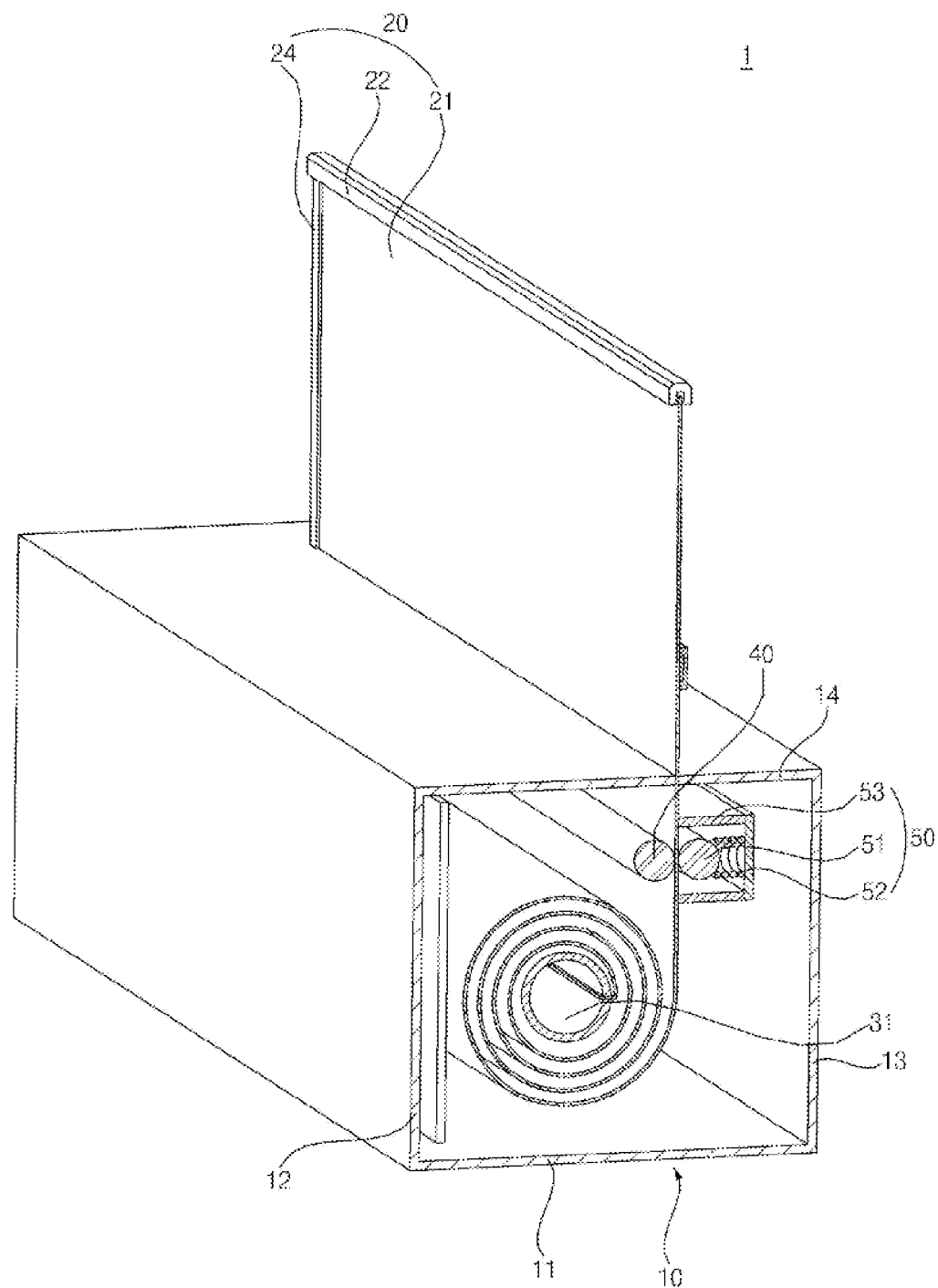

[FIG. 4]
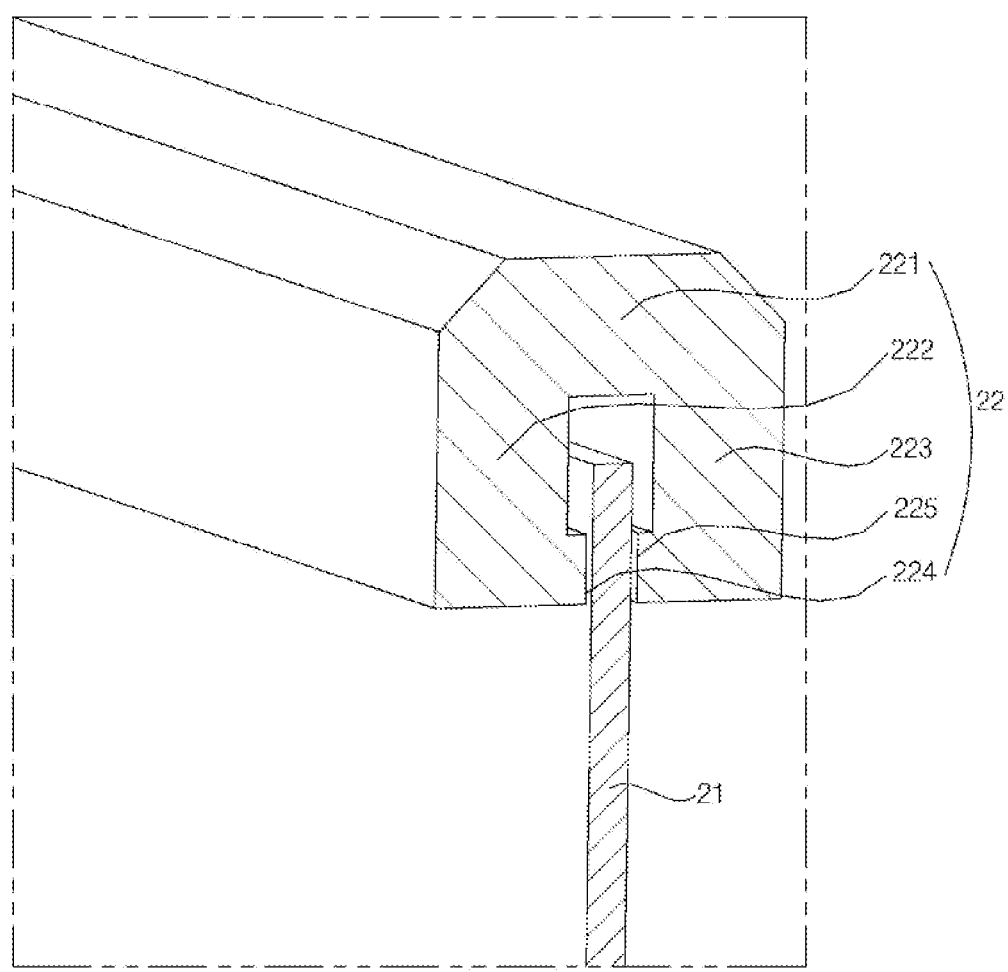

[FIG. 5]
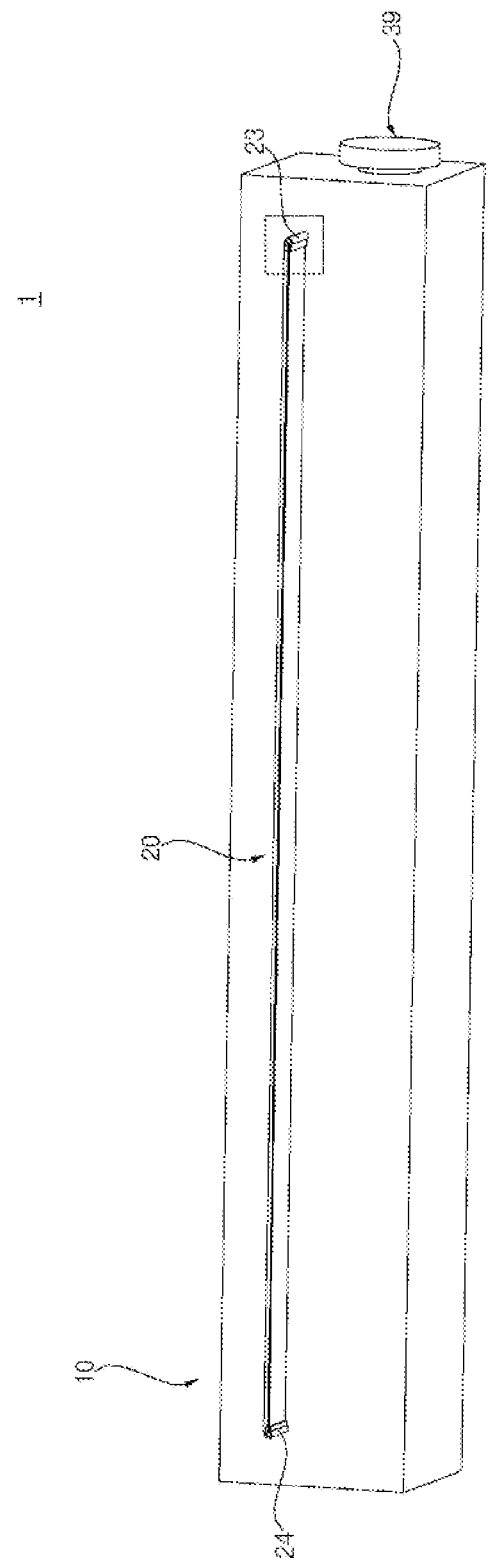

[FIG. 6]
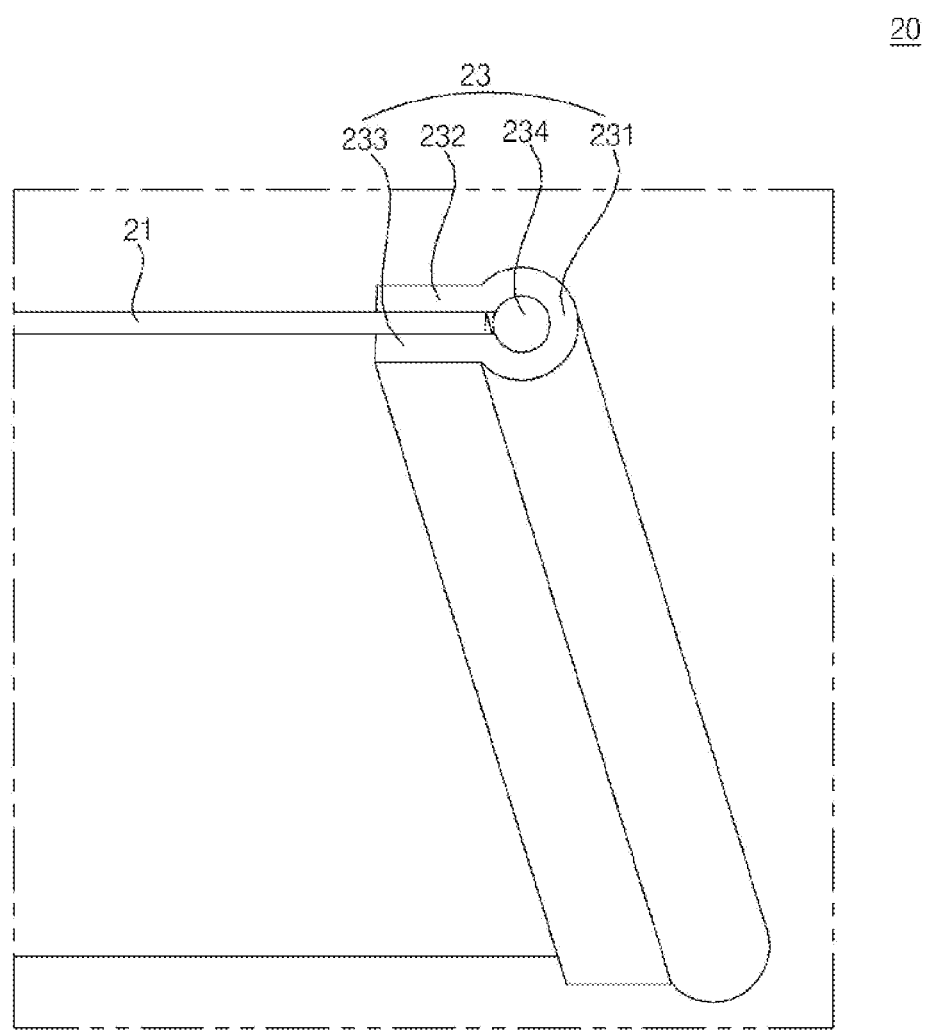

[FIG. 7]
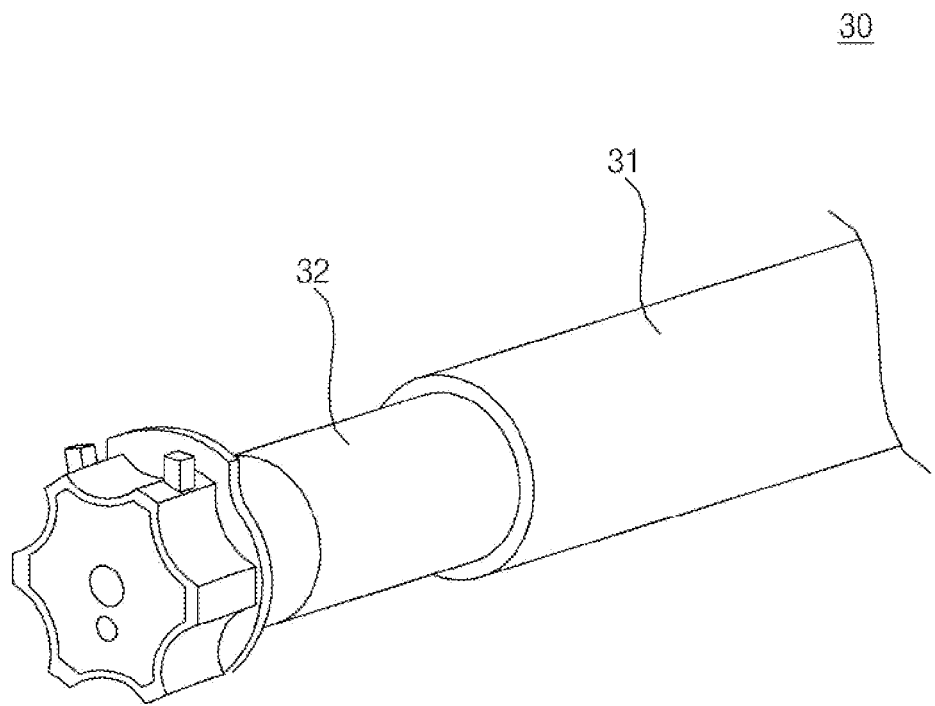

[FIG. 8]
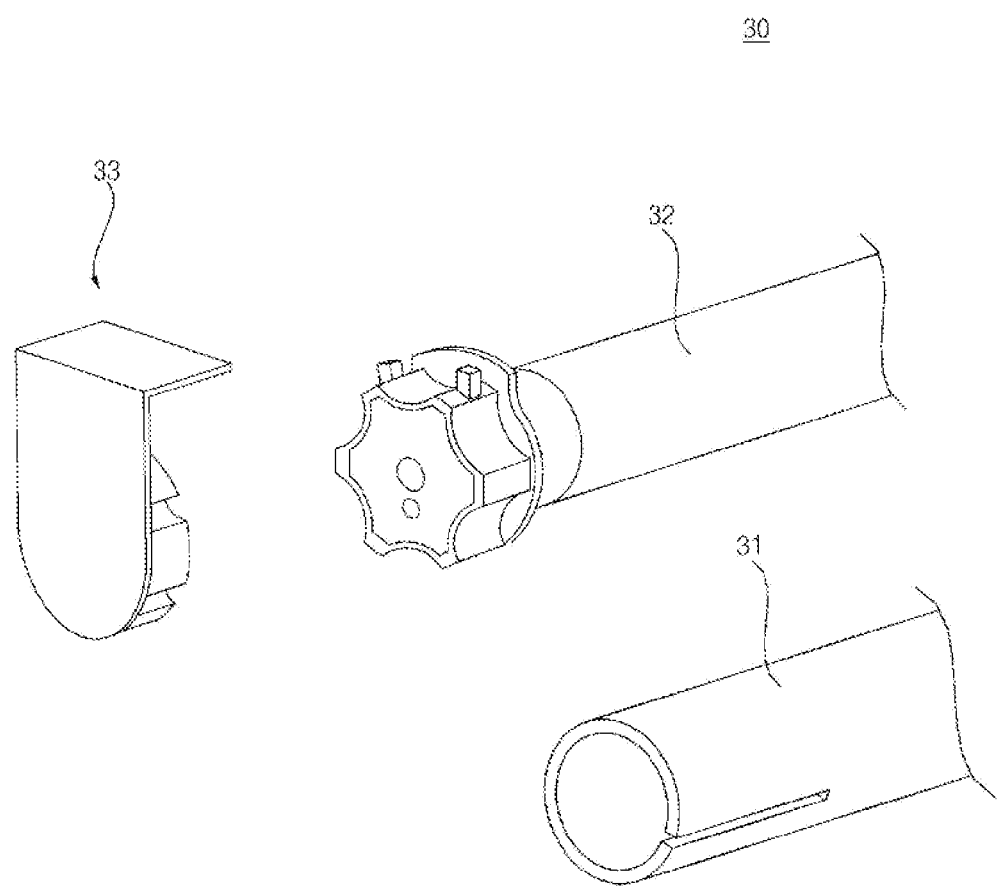

[FIG. 9]
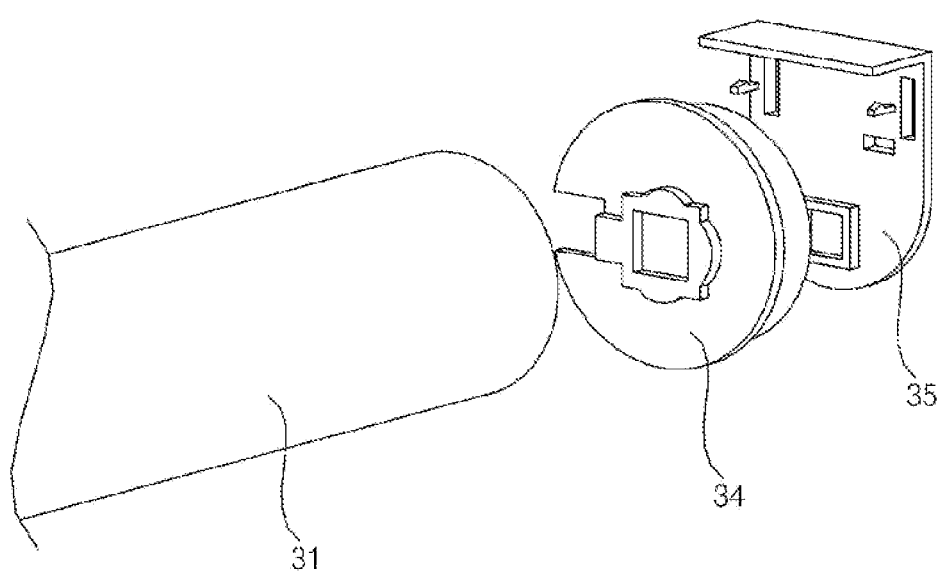

[FIG. 10]
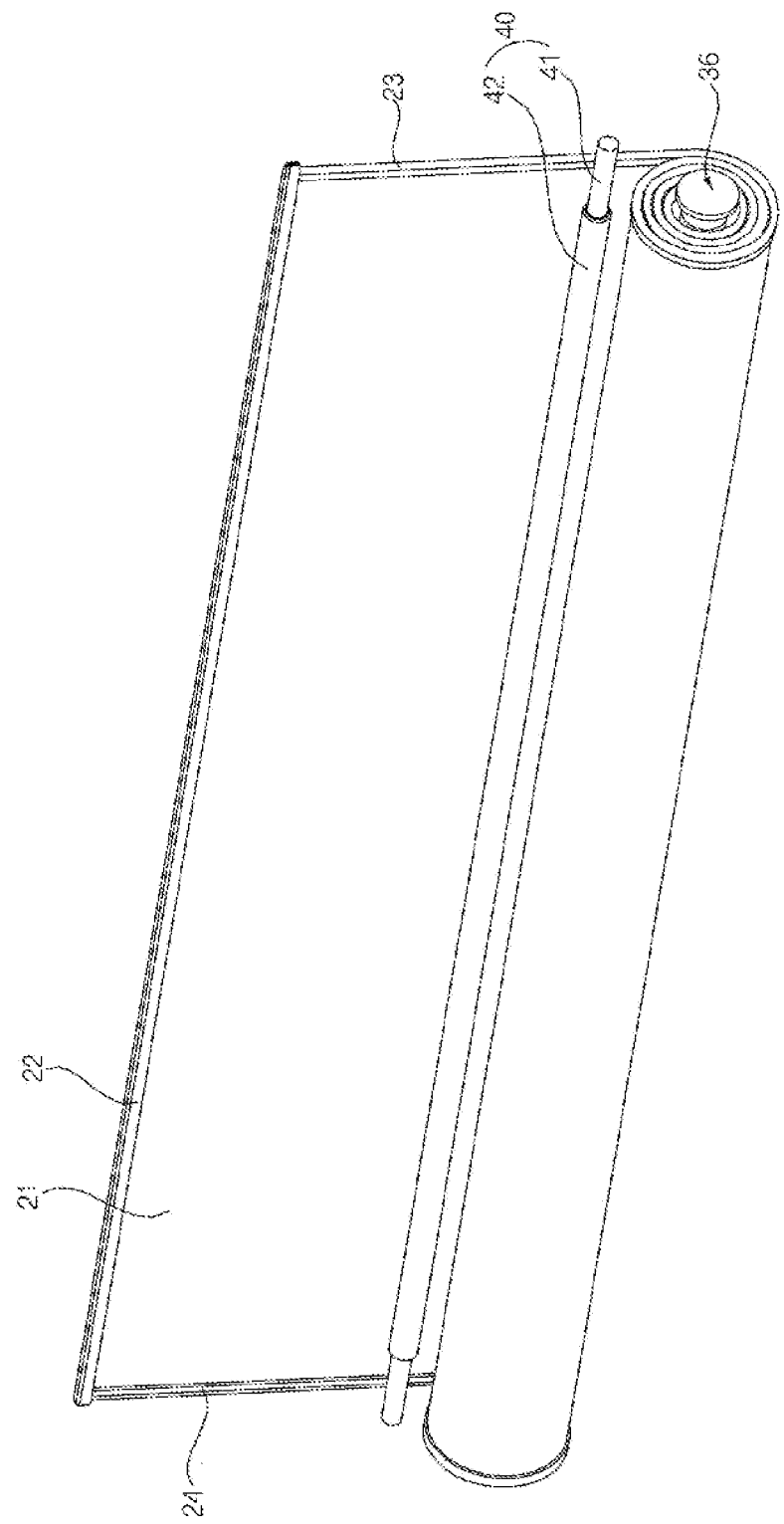

[FIG. 11]
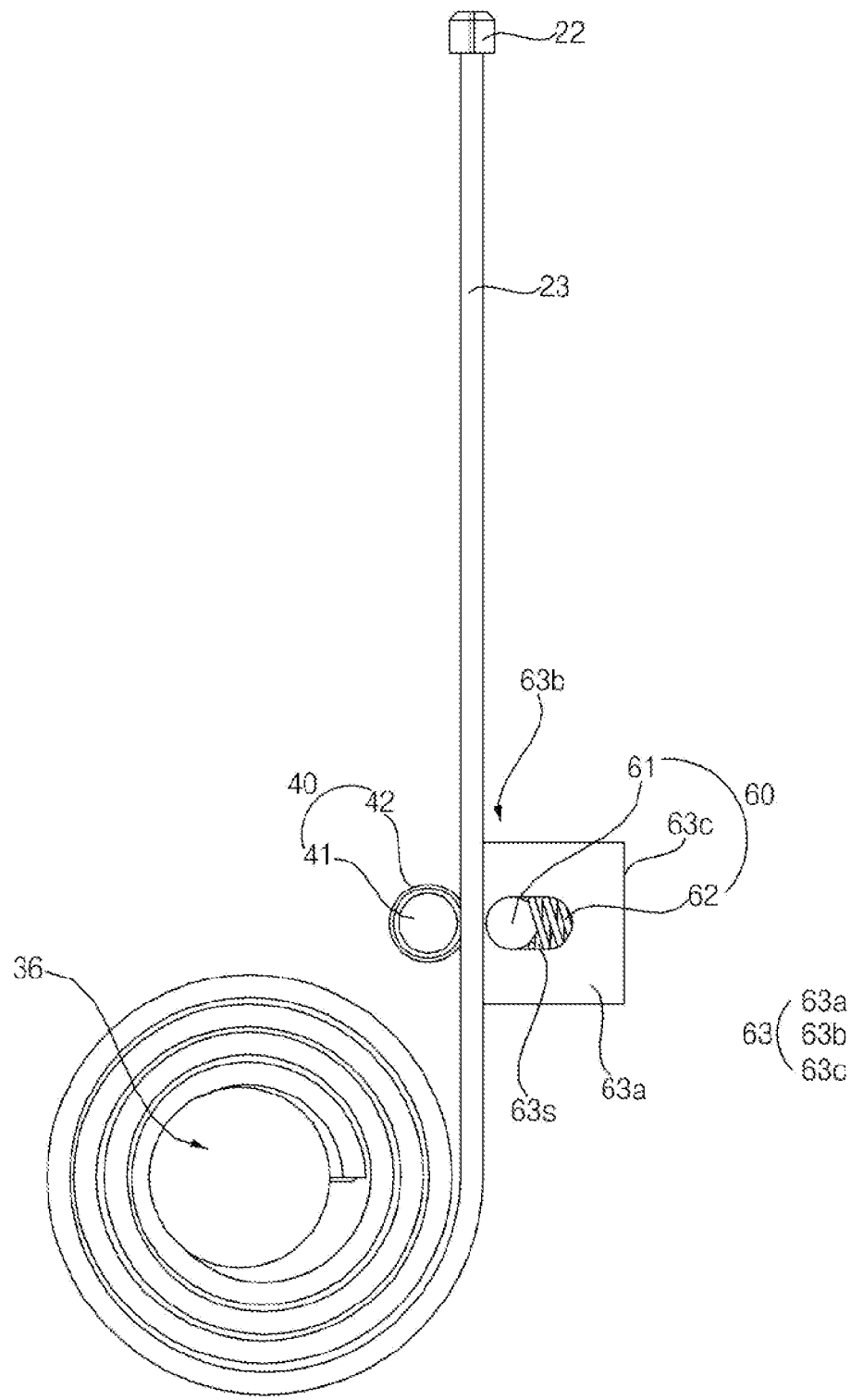

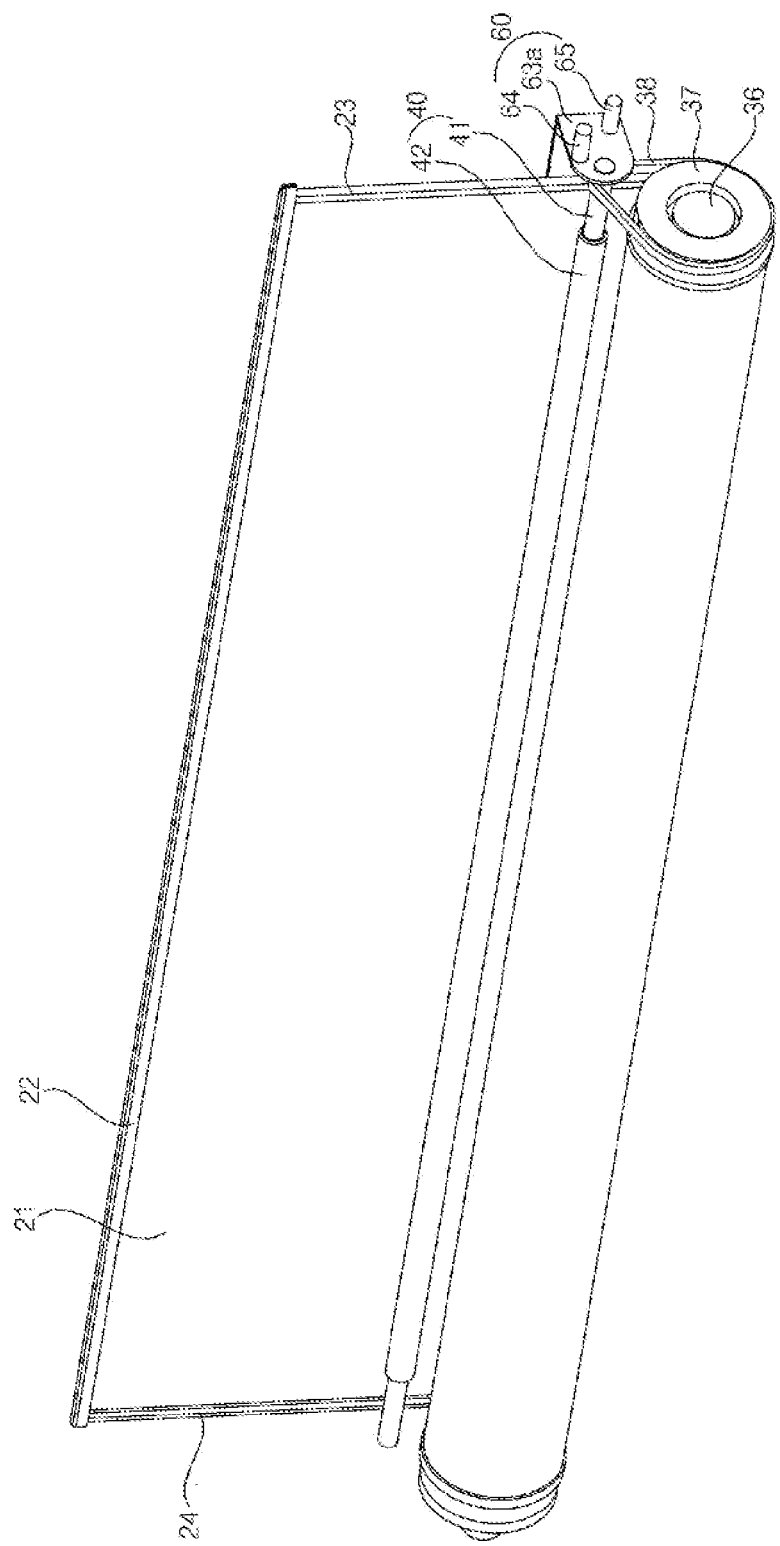
[FIG. 12]

[FIG. 13]
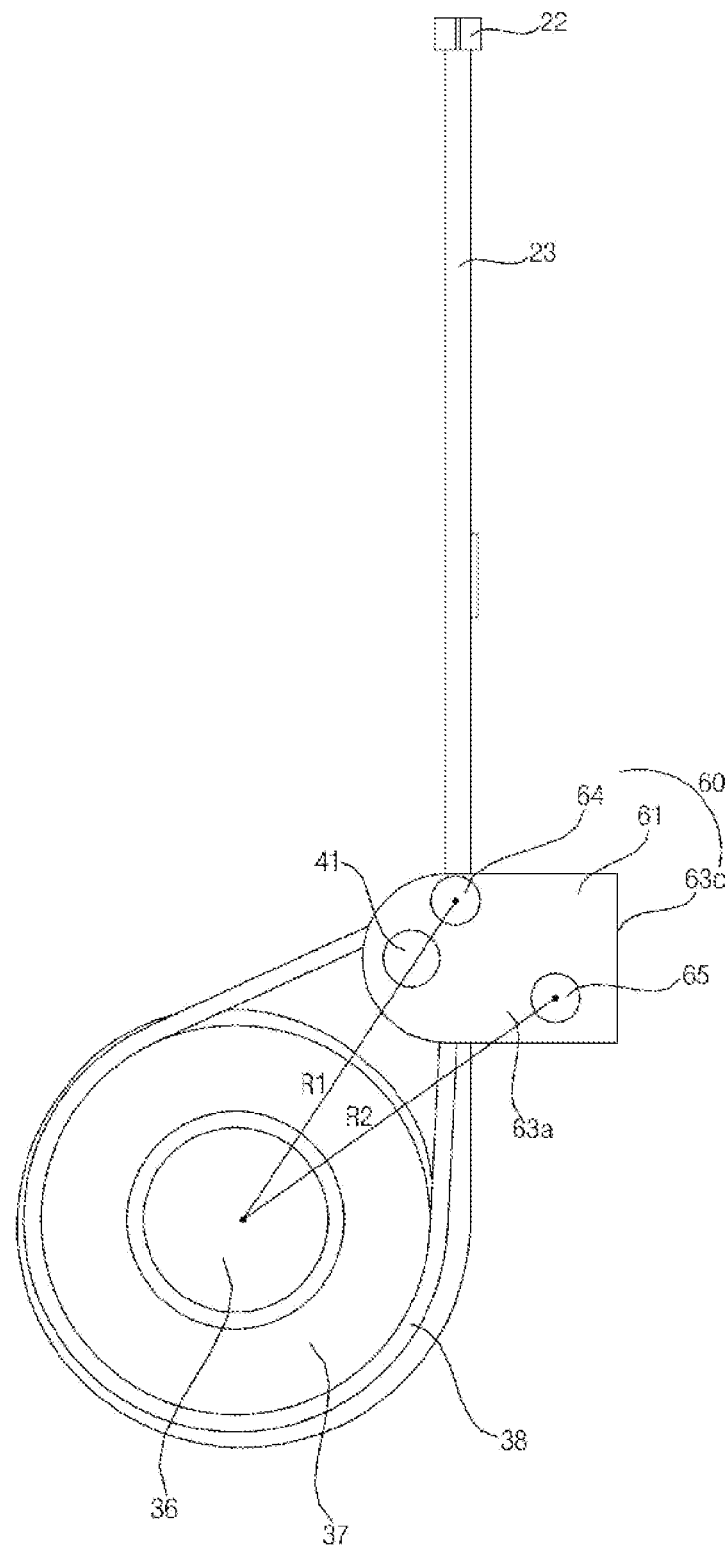

[FIG. 14]
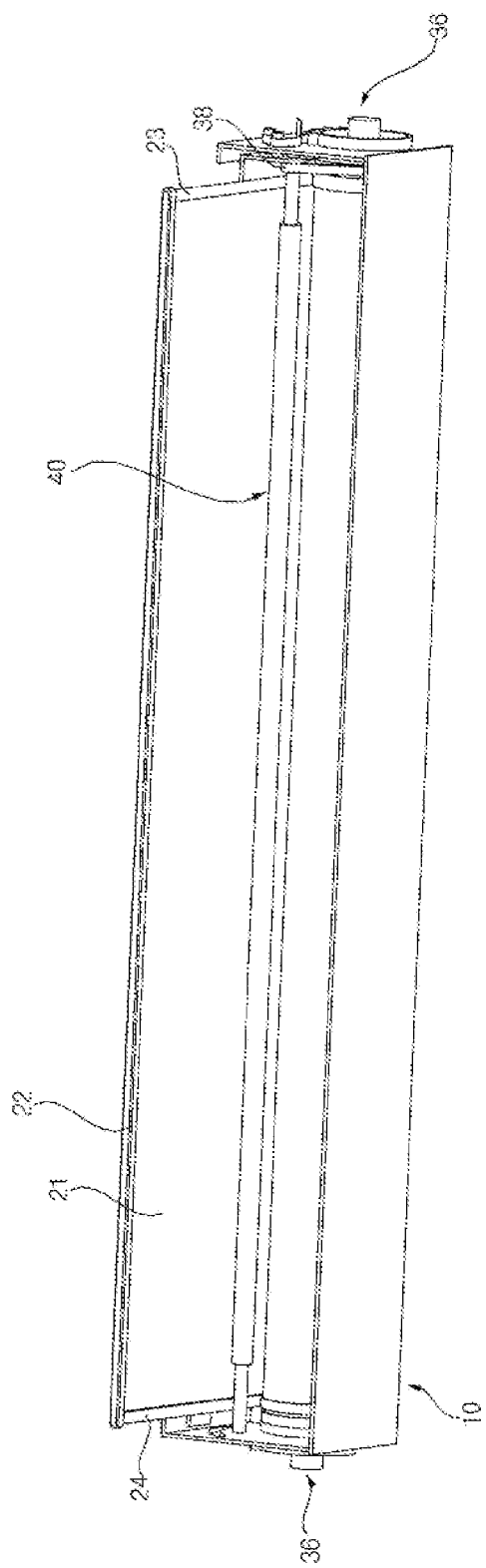

[FIG. 15]
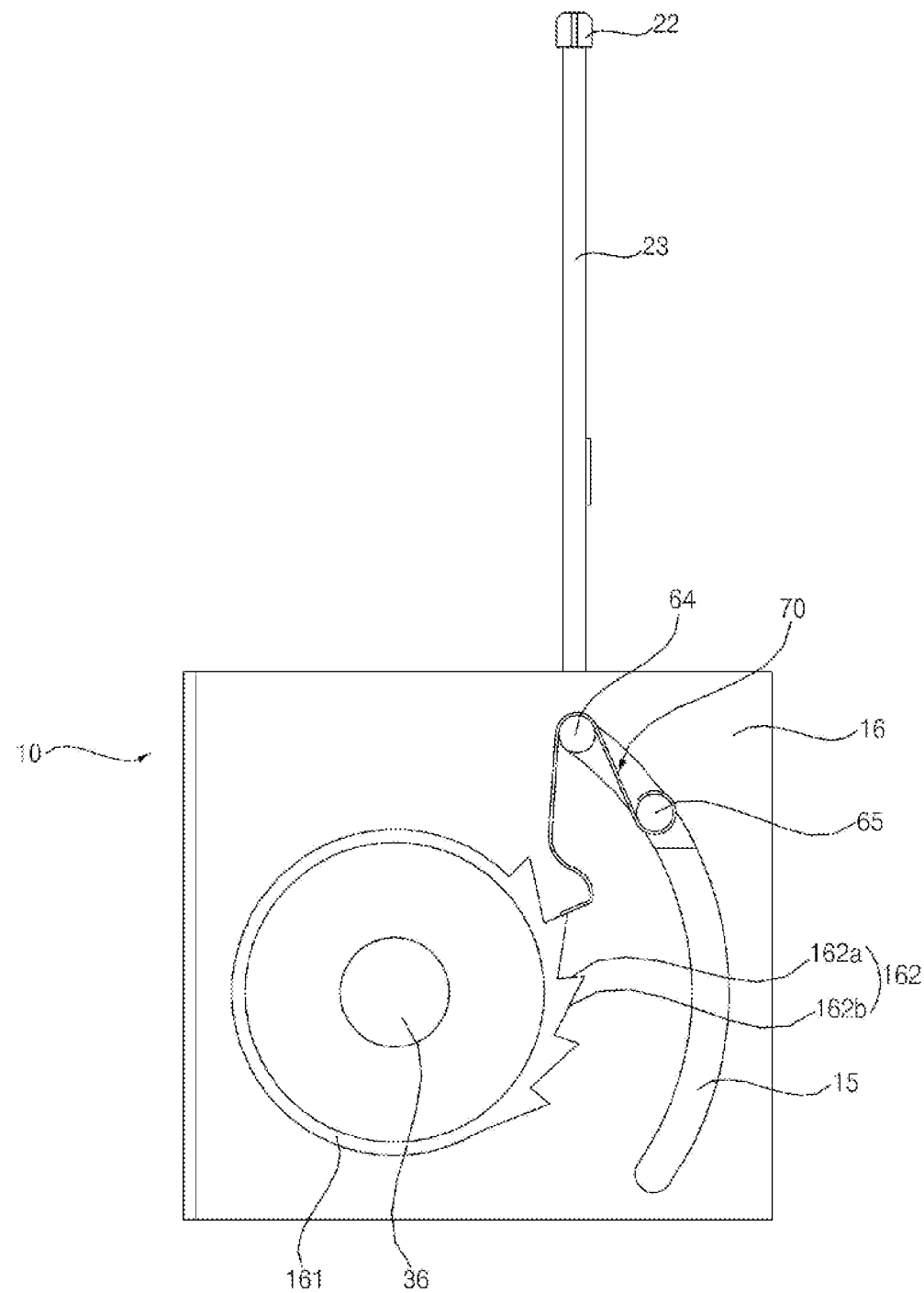

[FIG. 16]
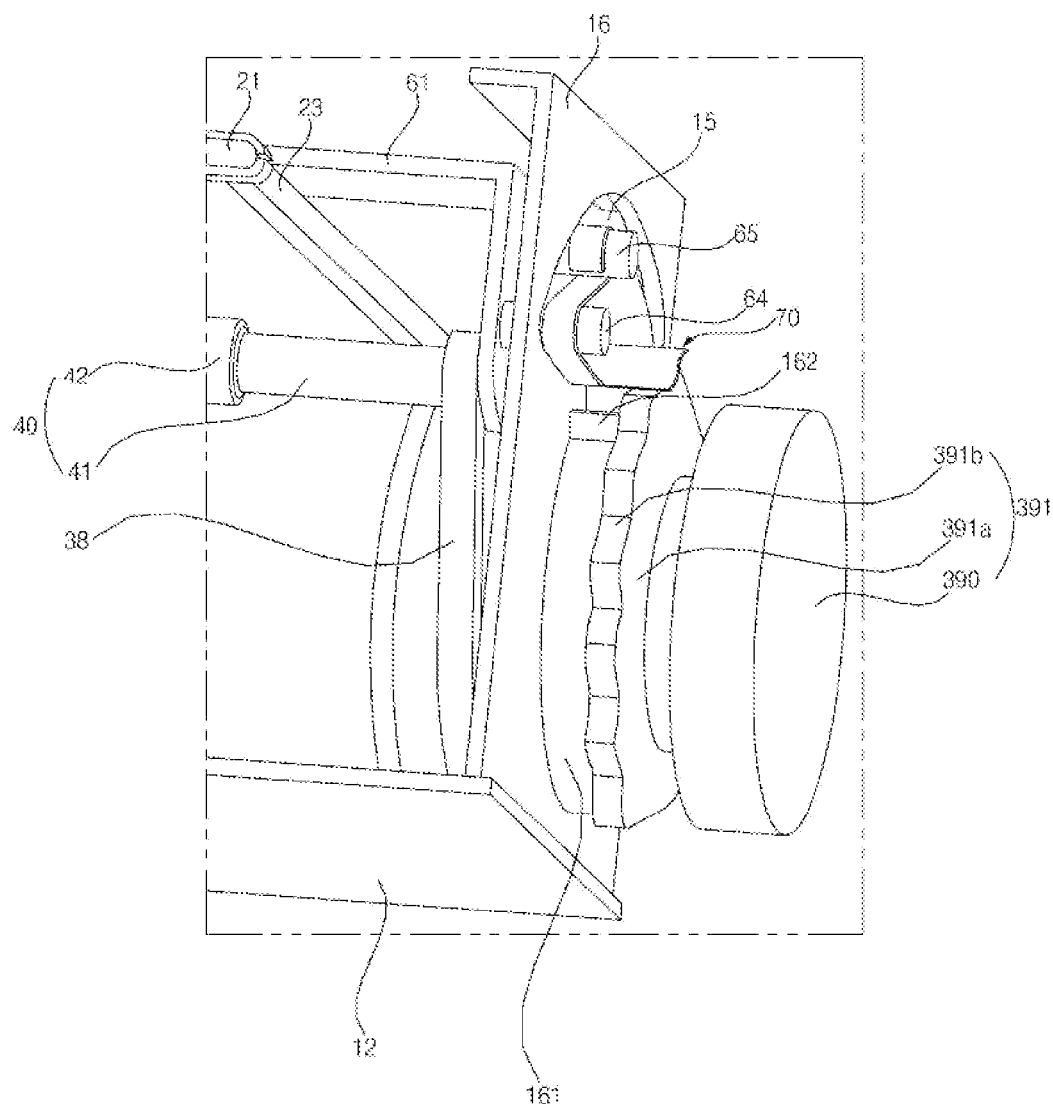

[FIG. 17]
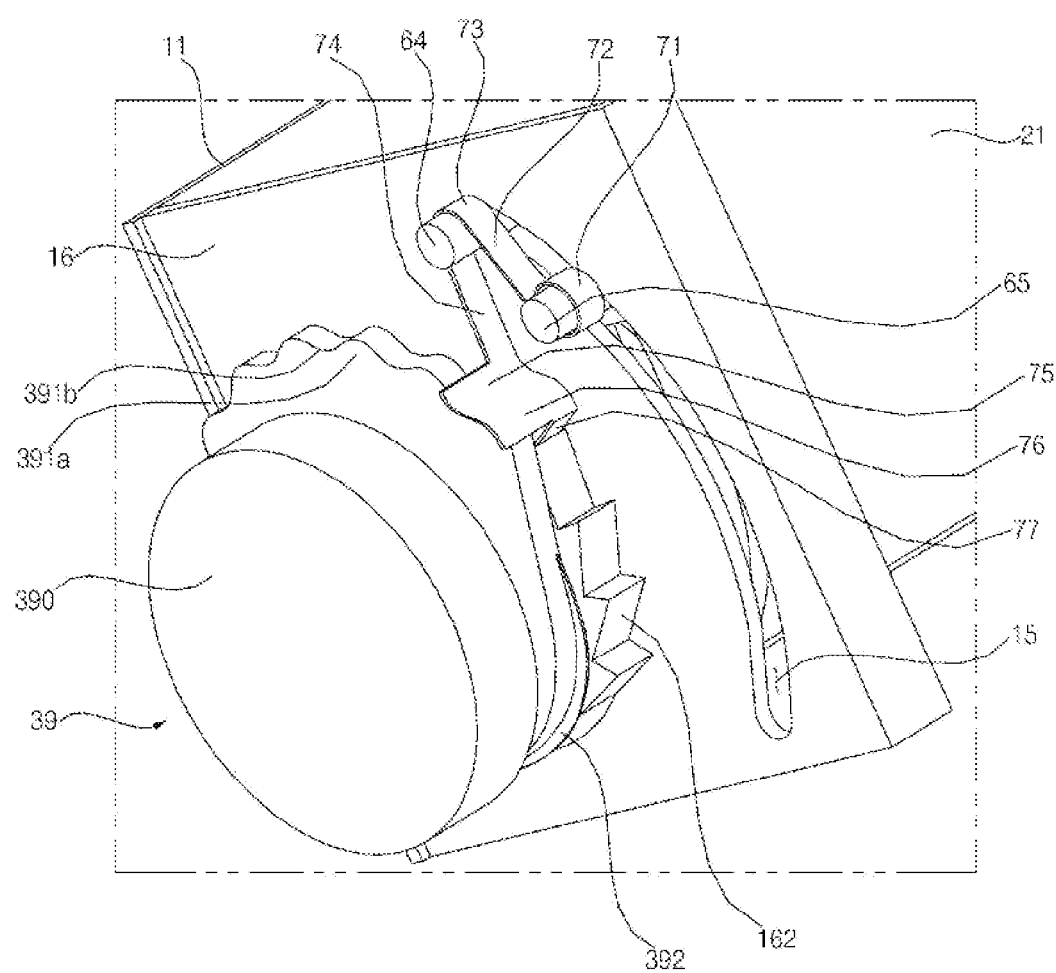

[FIG. 18]
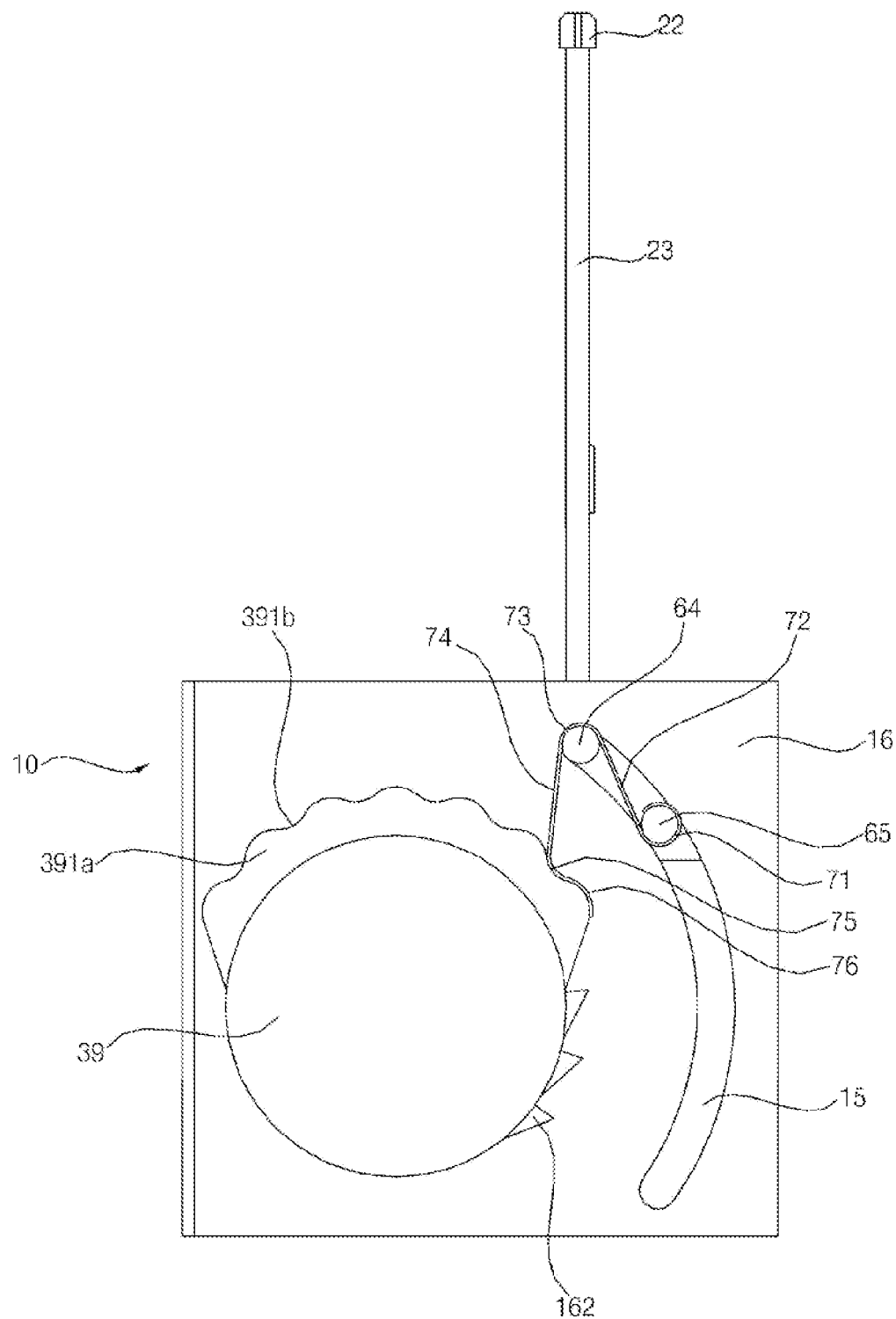

[FIG. 19]
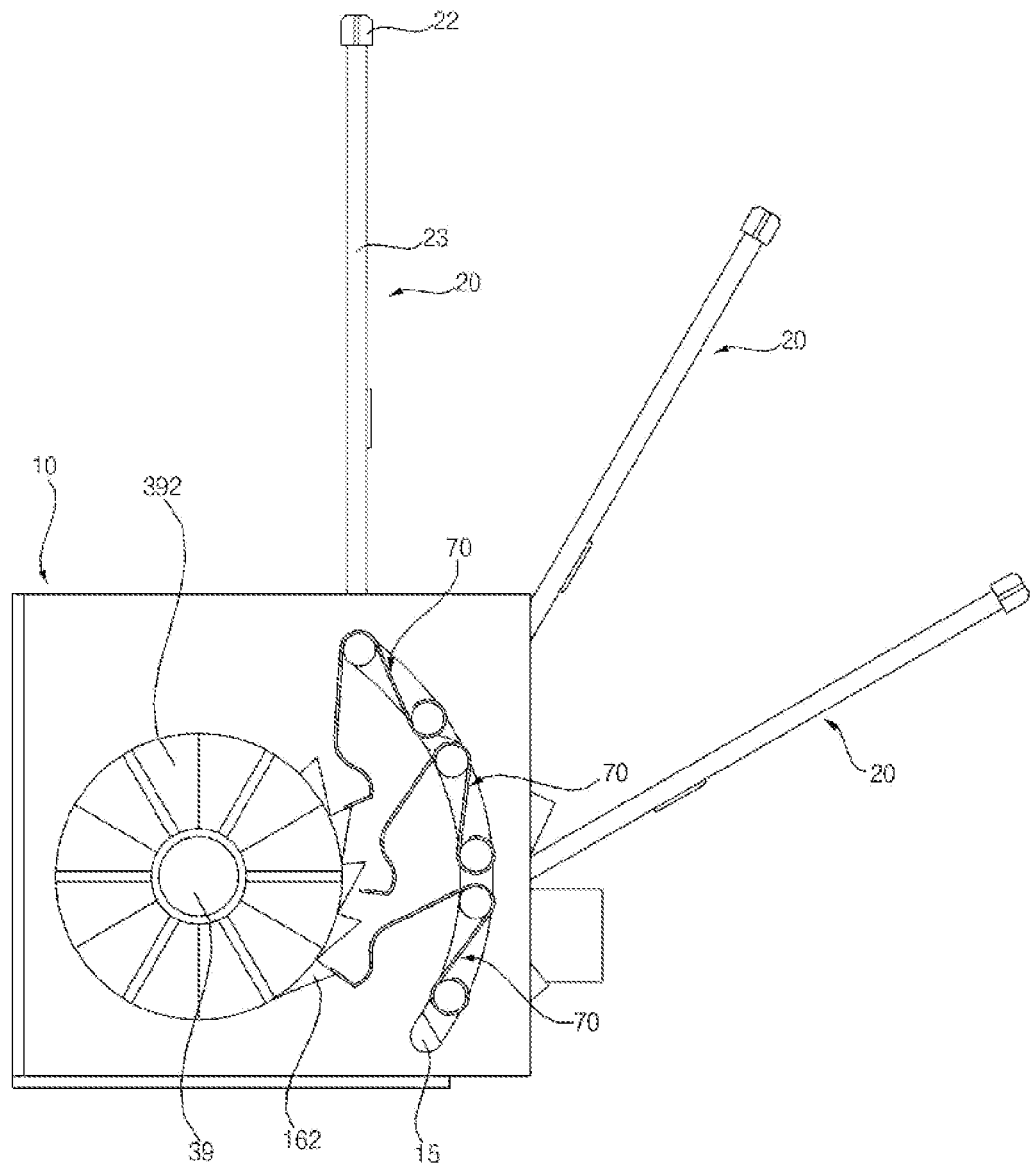

[FIG. 20]
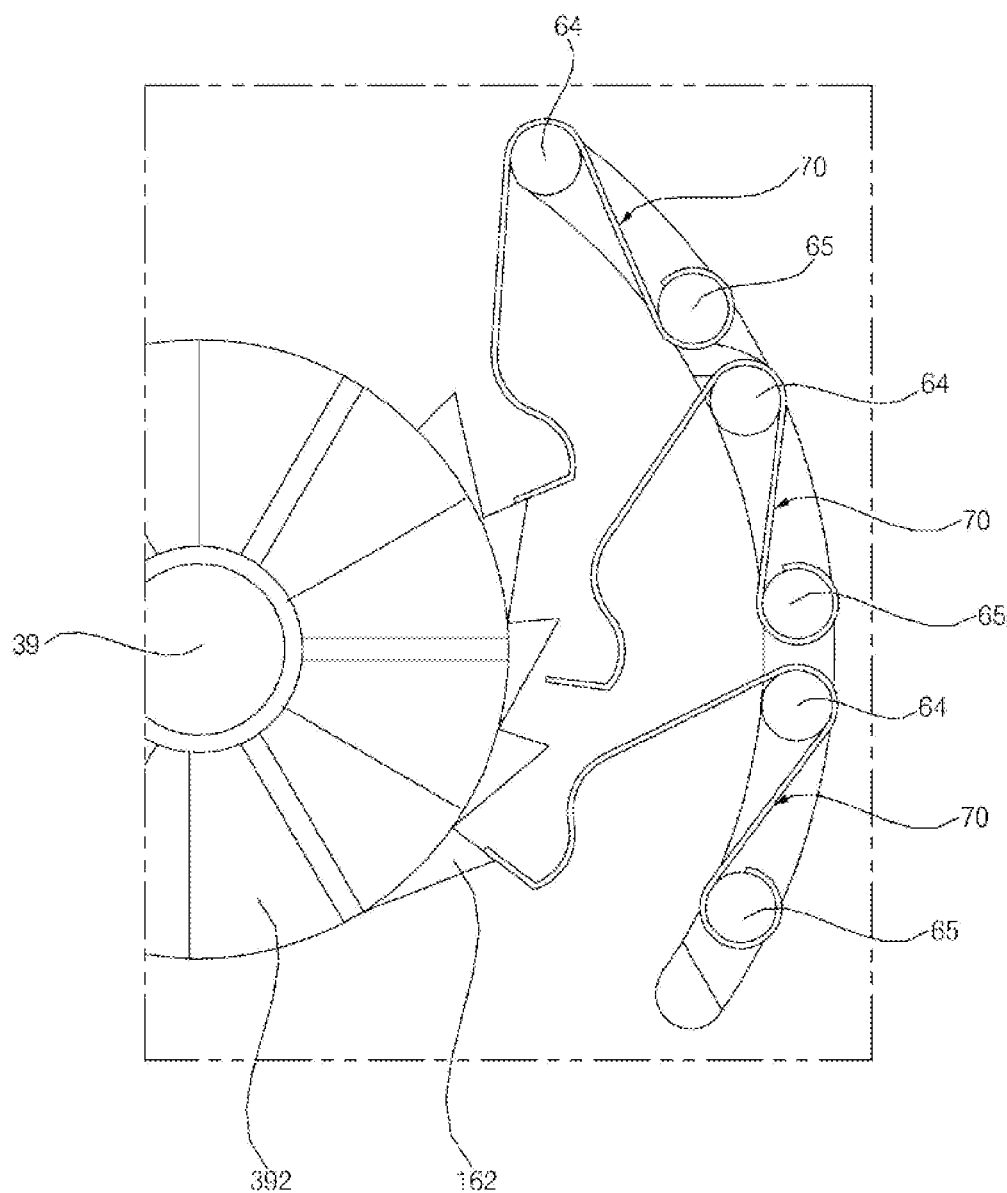

DISPLAY DEVICE

CROSS-REFERENCE TO RELATED APPLICATIONS

This application is the National Stage filing under 35 U.S.C. 371 of International Application No. PCT/KR2020/010711, filed on Aug. 13, 2020, which claims the benefit of earlier filing date and right of priority to Korean Application Nos. 10-2019-0100281, filed on Aug. 16, 2019, and 10-2020-0044411, filed on Apr. 13, 2020, the contents of which are all incorporated by reference herein in their entirety.

TECHNICAL FIELD

The present disclosure relates to a display device.

BACKGROUND ART

With the development of the information society, there have been growing demands for various types of display devices, and in order to meet these demands, research has been conducted thereon and various display devices have been used recently, including a liquid crystal display (LCD), a plasma display panel (PDP), an electroluminescent display (ELD), a vacuum fluorescent display (VFD), and the like.

Among them, a display device using an organic light emitting diode (OLED) has excellent luminance and viewing angle characteristics in comparison with a liquid crystal display device, and requires no backlight unit, such that the OLED display device can be implemented as an ultrathin display device.

In addition, a flexible display panel may be bent or rolled around a roller. The flexible display panel may be used to implement a display device that is unrolled from or rolled around the roller. Many studies have been made on a structure that allows the flexible display panel to be rolled around or unrolled from the roller.

DISCLOSURE OF INVENTION

Technical Problem

It is an object of the present disclosure to solve the above and other problems.

It is another object of the present disclosure to provide a mobile rollable display device.

It is yet another object of the present disclosure to provide a display device capable of securing flatness of a display panel.

It is still another object of the present disclosure to provide a display device capable of adjusting an angle of a display panel.

It is still another object of the present disclosure to provide a driving mechanism of a display device.

Technical Solution

In accordance with an aspect of the present disclosure, the above and other objects can be accomplished by providing a display device including: a flexible display panel; a panel roller which is elongated, and around which the display panel is rolled or unrolled; and a side frame coupled to one lateral side of the display panel and rolled around or unrolled from the panel roller along with the display panel, wherein the side frame includes: a core elongated along the lateral side of the display panel and facing the lateral side of the display panel; a first part covering the core; a second part extending from the first part and facing one surface of the display panel; and a third part extending from the first part and opposite to the second part with respect to the display panel.

Advantageous Effects

The display device according to the present disclosure has the following effects.

According to at least one of the embodiments of the present disclosure, a mobile rollable display device may be provided.

According to at least one of the embodiments of the present disclosure, a display device capable of adjusting an angle of a display panel may be provided.

According to at least one of the embodiments of the present disclosure, a driving mechanism of a display device may be provided.

Further scope of applicability of the present disclosure will become apparent from the detailed description given hereinafter. However, it should be understood that the detailed description and specific examples, while indicating preferred embodiments of the present disclosure, are given by illustration only, since various changes and modifications within the spirit and scope of the present disclosure will become apparent to those skilled in the art from this detailed description.

BRIEF DESCRIPTION OF DRAWINGS

FIGS. 1 to 20 are diagrams illustrating examples of a display device according to embodiments of the present disclosure.

MODE FOR CARRYING OUT THE INVENTION

Hereinafter, the present disclosure will be described in detail with reference to the accompanying drawings, in which the same reference numerals are used throughout the drawings to designate the same or similar components, and a redundant description thereof will be omitted.

Terms "module" and "unit" for elements used in the following description are given simply in view of the ease of the description, and do not have a distinguishing meaning or role.

Further, it will be noted that a detailed description of known arts will be omitted if it is determined that the detailed description of the known arts can obscure the embodiments of the invention. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that, although the terms first, second, etc., may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the singular forms are intended to include the plural forms as well, unless the context clearly indicates otherwise.

In the following description, even if an embodiment is described with reference to a specific figure, if necessary, reference numeral not shown in the specific figure may be referred to, and reference numeral not shown in the specific figure is used when the reference numeral is shown in the other figures.

Referring to FIGS. 1 to 3, a housing 10 may have a receiving space formed therein. A display panel 21 may be rolled or unrolled within the housing 10. The display panel 21 may be unrolled to be drawn out of the housing 10. A dial 39 for controlling movement of the display panel 21 may be provided on the side of the housing 10. The dial 39 may be used to adjust an angle of the display panel 21.

The display panel 21 may be rolled around or unrolled from a roll 31 of a panel roller 30. For example, the roll 31 may have a cylinder shape. The display panel 21, having one end fixed to the roll 31, may be rolled around the roll 31 to be stacked thereon. A display unit 20 may include the display panel 21, a top frame 22, and a side frame 23 and 24.

The housing 10 may include a bottom plate 11, a front plate 12, a rear plate 13, and a top plate 14. A portion of the top plate 14 and a portion of the rear plate 13 may be omitted. The roll 31 may be rotatably mounted in the housing 10.

A push roller 50 may be disposed between the display panel 21, which is unrolled from the roll 31, and the rear plate 13 of the housing 10. A guide roller 40 may be disposed opposite to the push roller 50 with respect to the display panel 21 unrolled from the roll 31. The push roller 50 may press the display panel 21 against the guide roller 40, thereby preventing the display panel 21 from drooping which may occur when the display panel 21 is unrolled from the roller 40, and may increase flatness of the display panel 21 that is drawn out of the housing 10.

Referring to FIGS. 3 and 4, a top frame 22 may be coupled to an upper side of the display panel 21. The top frame 22 may have an overall U-shaped cross-section. The top frame 22 may include a first part 221, a second part 222, a third part 223, a fourth part 224, and a fifth part 225. The top frame 22 may include metal or a synthetic resin. For example, the top frame 22 may be press fit into the display panel 21. In another example, the top frame 22 may be bonded to the display panel 21. In yet another example, the top frame 22 may be injection molded over an outer surface of the display panel 21.

The first part 221 may cover a lateral surface of the display panel 21. The second part 222 may be bent to extend from the first part 221 and may cover a portion of a front surface of the display panel 21 which is adjacent to an edge of the top side of the display panel 21. The third part 223 may be bent to extend from the first part 221 and may cover a portion of a rear surface of the display panel 21 which is adjacent to the edge of the top side. The fourth part 224 may be bent to extend from the second part 222 toward the front surface of the display panel 21. The fourth part 224 may also come into contact with the front surface of the display panel 21. The fifth part 225 may be bent to extend from the third part 223 toward the rear surface of the display panel 21. The fifth part 225 may also come into contact with the rear surface of the display panel 21. Accordingly, rigidity of the top side of the flexible display panel 21 may be achieved.

Referring to FIGS. 5 and 6, the side frame 23 and 24 may include the first part 231, the second part 232, the third part 233, and a core 234. The core 234 may be disposed adjacent to or may cover the lateral surface of the display panel 21. The core 234 may be elongated along the lateral side of the display panel 21. For example, the core 234 may be a shape memory alloy.

The first part 231 may cover the core 234. The core 234 may have an overall C-shaped cross section. The second part 232 may extend from the first part 231 to come into contact with a portion of the rear surface of the display panel 21. The third part 233 my extend from the first part 231 to come into contact with a portion of the front surface of the display panel 21. The third part 233 may be disposed opposite to the second part 232.

For example, the side frame 23 may be press fit into the display panel 21. In another example, the side frame 23 may be bonded to the display panel 21. In yet another example, the side frame 23 may be injection molded over an outer surface of the display panel 21.

Accordingly, the flexible display panel 21 may be rolled around the roll 31 (see FIG. 3), and may be maintained flat when unrolled from the roll 31.

Referring to FIGS. 7 and 8, the panel roller 30 may include the roll 31 and a motor 32. The roll 31 may have an elongated cylinder shape. The motor 32 may be received in the roll 31, and may be coupled to one end of the roll 31. A bracket 33 may be coupled to the motor 32 which is coupled to the one end of the roll 31. The motor 32 may have one side fixed to the bracket and the other side fixed to the roll 31.

Referring to FIGS. 7 and 9, a bearing 34 may be fixed to the other end of the roll 31. The bracket 35 may be fixed to the bearing 34. The roll 31 may be rotated with respect to the bracket 35. Accordingly, the roll 31 may be rotated with respect to the bracket 35 by the motor 32.

Referring to FIG. 10, the display panel 21 may be rolled around the roll 31 (see FIG. 3). A roll shaft 36 may be coupled to one end of the roll 31 in a longitudinal direction of the roll 31. When the display panel 21 is rolled around the panel roller 30 (see FIG. 8), the side frame 23 and 24 may also be rolled around the roll 31. When rolled around the roll 31, the side frame 23 and 24 may have a circular shape, and when unrolled from the roll 31, the side frame 23 and 24 may have a straight line shape. The roll shaft 36 may be disposed adjacent to the side frame 23 and 24 rolled around the roll 31.

The guide roller 40 may be disposed between the display panel 21, rolled around the roll 3, and the display panel 21 unrolled from the roll 31. The guide roller 40 may include a shaft 41 and a roller 42. The shaft 41 may be elongated in the longitudinal direction of the roll 31 of the panel roller 30. The shaft 41 may be inserted into the roller 42. The roller 42 may be rotated together with the shaft 41.

For example, the shaft 41 may be a bar including metal, and the roller 42 may be a cylinder including urethane. The guide roller 40 may be disposed adjacent to the front surface of the display panel 21 unrolled from the panel roller 30. In addition, the guide roller 40 may be disposed adjacent to the rear surface of the display panel 21 rolled around the panel roller 30.

Referring to FIGS. 11 and 12, the push roller 60 may be disposed opposite to the guide roller 40 with respect to the display panel 21. The push roller 60 may include a frame 63, a roller 61, and an elastic member 62. The frame 63 may be a plate elongated in a longitudinal direction of the guide roller 40 and having both ends which are bent. The frame 63 may have an overall U-shape.

The frame 63 may include a first part 63*c*, a second part 63*a*, and a third part 63*b*. The first part 63*c* may be a plate elongated in the longitudinal direction of the guide roller 40. The second part 63*a* may be bent from one end of the first part 63*c*, and the third part 63*b* may be bent from the other end of the first part 63*c*. A slit 63*s* may be formed in the second part 63*a* and/or the third part 63*b*. The slit 63*s* may extend from the guide roller 40 toward the first part 63*c*.

One end or both ends of the roller 61 may be inserted into the slit 63*s*. The roller 61 may be moved in the slit 63*s* in a direction from the guide roller 40 toward the first part 63*c*. The elastic member 62 may have one side supported by the frame 63 and the other side supported by the roller 61, thereby providing elasticity to the roller 61. Accordingly, the push roller 61 may push the display panel 21 to the guide roller 40.

Referring to FIGS. 12 and 13, the frame 63 may be a plate elongated in the longitudinal direction of the guide roller 40 and having both ends which are bent. The frame 63 may have an overall U-shape.

Pins 64 and 65 may be formed on one side or both sides of the frame 63. The pins 64 and 65 may be formed on an outer surface of the second part 63*a* and/or the third part 63*b*. A plurality of pins 64 and 65 may be formed. A first pin 64 may be positioned at a first distance R1 from the roll shaft 36. A second pin 65 may be may be positioned at a predetermined second distance R2 from the roll shaft 36. For example, the first distance R1 may be equal to the second distance R2. The roll shaft 36 may be a pivot center of the frame 63.

A pulley 37 may be connected to the roll shaft 36. The pulley 37 may be rotated together with the roll shaft 36. A belt 38 may connect the pulley 37 and the shaft 41 of the guide roller 40. When the pulley 37 rotates, the shaft 41 may be rotated by the belt 38. Accordingly, the display panel 21 may be stably unrolled from the panel roller 30.

Referring to FIGS. 14 and 15, the panel roller 30 (see FIG. 8) may be mounted in the housing 10. The panel roller 30 may be rotatably mounted in the housing 10. The roll shaft 36 may pass through a side plate 16 of the housing 10. A pivot slit 15 may be formed in the side plate 16 of the housing 10. A distance from the roll shaft 36 to the pivot slit 15 may be equal to the first distance R1 and/or the second distance R2 described above with reference to FIG. 13. The pivot slit 15 may form a fan-shaped arc. The pins 64 and 65 may be inserted into the pivot slit 15 to be moved.

A circular rib 161 may be formed around the roll shaft 36 on the side plate 16 of the housing 10. The circular rib 161 may protrude from an outer surface of the side plate 16 of the housing 10. Saw teeth 162 may be formed on the circular rib 161 facing the pivot slit 15. For example, five sawteeth 162 may be formed. For example, the sawteeth 162 may have a vertical plane 162*a* having a normal line of the circular rib 161, and an inclined surface 162*b* having an acute angle relative to a tangent line. A leaf spring 70 may be coupled to the pins 64 and 65, and may be caught by the sawteeth 162.

Referring to FIGS. 16 and 17, the dial 39 may be coupled or fixed to the roll shaft 36 (see FIG. 15). The dial 39 may be rotated together with the roll shaft 36. The dial 39 may include a head 390 and a wave plate 391*a*. The head 390 may have a disc shape with a predetermined thickness. The wave plate 391*a* may extend in a radial direction of the head 390 beyond the diameter of the head 390. The wave plate 391*a* may have a wave surface 391*b* formed along a circumferential direction of the head 390. A washer 392 may be disposed between the dial 39 and the circular rib 161.

The leaf spring 70 may include a ring 71, a hairpin 72, 73, and 74, a blade 75 and 76, and a stopper 77. The ring 71 may be fixed to the second pin 65. The hairpin 72, 73, and 74 may be laid over the first pin 64. The hairpin 72, 73, and 74 may extend from the ring 71, and may cover the first pin 64 by alternately connecting the first pin 64 and the second pin 65. The hairpin 72, 73, and 74 may include a first part 72 connecting the first pin 64 and the second pin 65, a second part 73 covering the first pin 64, and a third part 74 connecting the first pin 64 and the blade 75 and 76. The blade 75 and 76 may be formed at the end of the hairpin 72, 73, and 74, and may come into contact with the wave surface 391*a* and the wave plate 39*b*.

The hairpin 72, 73, and 74 may provide elasticity for the blade 75 and 76 to come into contact with the wave surface 391*b*. For example, the blade 75 and 76 may have ridge and valley corresponding to the wave surface 391*b*. The stopper 77 may be bent to extend from the ends of the blade 75 and 76 toward the center of the circular rib 161. The stopper 77 may be caught by the sawteeth 162.

Referring to FIGS. 18 to 20, the display panel 21 may receive torque in a clockwise direction with respect to the dial 39. To this end, the torque or elasticity may be applied to the display panel 21 or the panel roller 30.

When the dial 39 is rotated, the wave surface 391*b* may raise the blade 75 and 76. For example, ridges of the wave surface 391*b* come into contact with the valley of the blade 75 and 76, such that the blade 75 and 76 may be moved away from the wave surface 391*b*. The stopper 77, caught by the sawteeth 162, may move from the vertical plane 162*a* toward the inclined surface 162*b*.

The washer 392 may be, for example, a wave washer. The dial 39 may be rotated stepwise by the wave washer 392. When the dial 39 is rotated stepwise to raise the blade 75 and 76, the stopper 77 may move stepwise over the sawteeth 132. Accordingly, an angle of the display panel 21 may be adjusted.

According to an aspect of the present disclosure, there is provided a display device including: a flexible display panel; a panel roller which is elongated, and around which the display panel is rolled or unrolled; and a side frame coupled to a lateral side of the display panel and rolled around or unrolled from the panel roller along with the display panel, wherein the side frame includes: a core elongated along the lateral side of the display panel and facing the lateral side of the display panel; a first part covering the core; a second part extending from the first part and facing one surface of the display panel; and a third part extending from the first part and opposite to the second part with respect to the display panel.

According to another aspect of the present disclosure, the core may be bent when the display panel is rolled around the panel roller, and may be unbent when the display panel is unrolled from the panel roller.

According to yet another aspect of the present disclosure, the panel roller may include a hollow roll, around which the display panel is rolled; a motor inserted into the roll and coupled to one end of the roll to rotate the roll; and a bearing coupled to an opposite end of the roll.

According to still another aspect of the present disclosure, the display device may further include a housing that provides a receiving space in which the panel roller is rotatably mounted therein, wherein the panel roller may further include: a first bracket fixed to the motor and coupled to the housing; and a second bracket fixed to the bearing and coupled to the housing.

According to still another aspect of the present disclosure, the display device may further include: a guide roller elongated along the panel roller and disposed between the display panel, which is unrolled from the panel roller, and the panel roller; and a push roller disposed opposite to the guide roller with respect to the display panel.

According to still another aspect of the present disclosure, the push roller may include: a frame elongated in a longitudinal direction of the panel roller; a roller installed to be movable from the frame toward the guide roller, and opposite to the guide roller with respect to the display panel; and an elastic member disposed between the frame and the roller and providing elasticity to the roller.

According to still another aspect of the present disclosure, the display device may further include: a guide roller elongated along the panel roller and disposed between the display panel, which is unrolled from the panel roller, and the panel roller; and a frame which is opposite to the guide roller with respect to the display panel, and in which the guide roller is rotatably mounted; a pulley fixed to one end of the panel roller and rotated together with the panel roller; and a belt connecting the guide roller and the pulley.

According to still another aspect of the present disclosure, the display device may further include: a housing that provides a receiving space in which the panel roller is rotatably mounted therein; a guide roller elongated along the panel roller and disposed between the display panel, which is unrolled from the panel roller, and the panel roller; and a frame which is opposite to the guide roller with respect to the display panel, and in which the guide roller is rotatably mounted, wherein the housing may further include a slit spaced apart from a rotating shaft of the panel roller and forming an arc with respect to the rotating shaft of the panel roller, wherein the frame may include: at least one pin inserted into the slit so as to be movable along the arc formed by the slit.

According to still another aspect of the present disclosure, the display device may further include: a circular rib having a radius smaller than a radius of the slit about the rotating shaft of the panel roller, and formed on an outer surface of the housing; and a dial rotated together with the panel roller on the circular rib.

According to still another aspect of the present disclosure, the dial may include: a head; and a wave plate disposed between the head and the circular rib, and having a wave surface formed along a circumferential direction of the head, wherein the circular rib may include: a plurality of sawteeth sequentially formed on an outer surface of the circular rib along a circumferential direction of the circular rib.

According to still another aspect of the present disclosure, the display device may further include a leaf spring coupled to the at least one pin, wherein the lead spring may include: a blade having ridge and valley corresponding to the wave surface and moving on the wave surface; a hairpin having one side fixed to the at least one pin and an opposite side connected to the plate, and having elasticity; and a stopper formed on the blade and caught by the plurality of sawteeth.

According to still another aspect of the present disclosure, when the dial is rotated, the stopper may be caught by or released from the plurality of sawteeth, with the blade sliding over the wave surface.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:
1. A display device comprising:
a flexible display panel;
a panel roller which is elongated, and around which the flexible display panel is rollable;
a side frame coupled to a lateral side of the flexible display panel and rollable around the panel roller along with the flexible display panel;
a housing that provides a receiving space in which the panel roller is rotatably mounted;
a guide roller elongated along the panel roller and disposed between the panel roller and the flexible display panel when the flexible display panel is unrolled from the panel roller; and
a frame which is opposite to the guide roller with respect to the flexible display panel, and in which the guide roller is rotatably mounted,
wherein the side frame comprises:
a core elongated along the lateral side of the flexible display panel and facing the lateral side of the flexible display panel,
wherein the core is a shape memory alloy with a straight initial shape,
wherein the core is bent when the flexible display panel is rolled around the panel roller, and the flexible display panel is unbent together with the core by a restoring force of the core when the flexible display panel is unrolled from the panel roller,
wherein the housing has a slit spaced apart from a rotating shaft of the panel roller and forming an arc with respect to the rotating shaft of the panel roller, and
wherein the frame comprises at least one pin inserted into the slit so as to be movable along the arc formed by the slit.

2. The display device of claim 1, wherein the panel roller comprises:
a hollow roll, around which the flexible display panel is rollable;
a motor inserted into the hollow roll and coupled to a first end of the hollow roll to rotate the hollow roll; and
a bearing coupled to a second end of the hollow roll opposite to the first end.

3. The display device of claim 2,
wherein the panel roller further comprises:
a first bracket fixed to the motor and coupled to the housing; and a second bracket fixed to the bearing and coupled to the housing.

4. The display device of claim 3, further comprising:
a push roller opposite to the guide roller with respect to the flexible display panel,
wherein the frame is included in the push roller.

5. The display device of claim 4, wherein the frame is elongated along a longitudinal direction of the panel roller, and
wherein the push roller comprises:
a roller installed to be movable from the frame toward the guide roller, and opposite to the guide roller with respect to the flexible display panel; and
an elastic member disposed between the frame and the roller and configured to provide elasticity to the roller.

6. The display device of claim 3, further comprising:
a pulley fixed to an end of the panel roller and rotatable together with the panel roller; and
a belt connecting the guide roller and the pulley.

7. The display device of claim 1, further comprising:
a circular rib having a radius smaller than a radius of the slit about the rotating shaft of the panel roller, and located at an outer surface of the housing; and
a dial rotatable together with the panel roller on the circular rib.

8. The display device of claim 7, wherein the dial comprises:
a head; and
a wave plate disposed between the head and the circular rib, and having a wave surface along a circumference of the head,
wherein the circular rib comprises:
a plurality of sawteeth located at an outer surface of the circular rib along a circumference of the circular rib.

9. The display device of claim 8, further comprising a leaf spring coupled to the at least one pin,
wherein the leaf spring comprises:
a blade having a ridge and a valley corresponding to the wave surface and movable along the wave surface;
a hairpin having a first side fixed to the at least one pin and a second side opposite to the first side and connected to the plate, and having elasticity; and
a stopper located on the blade and configured to be caught by the plurality of sawteeth.

10. The display device of claim 9, wherein when the dial is rotated, the stopper is caught by or released from the plurality of sawteeth, with the blade sliding over the wave surface.

11. The display device of claim 1,
wherein the side frame further comprises:
a first portion covering the core;
a second portion extending from the first portion and facing a surface of the flexible display panel; and
a third portion extending from the first portion and opposite to the second portion with respect to the flexible display panel.

* * * * *